United States Patent [19]

Reuschel

[11] 4,023,520
[45] May 17, 1977

[54] REACTION CONTAINER FOR DEPOSITION OF ELEMENTAL SILICON

[75] Inventor: Konrad Reuschel, Vaterstetten, Germany

[73] Assignee: Siemens Aktiengesellschaft, Berlin & Munich, Germany

[22] Filed: Apr. 21, 1976

[21] Appl. No.: 679,088

[30] Foreign Application Priority Data

Apr. 28, 1975  Germany .......................... 2518853

[52] U.S. Cl. ........................................ 118/8; 118/49
[51] Int. Cl.² .......................................... C23C 13/08
[58] Field of Search ........................... 118/48–49.5, 118/8; 427/50–52, 69, 70, 78, 91, 99, 107, 109, 166, 167, 248–252; 264/81, 33, 8; 250/343

[56] References Cited
UNITED STATES PATENTS

| | | | |
|---|---|---|---|
| 3,293,074 | 12/1966 | Nickl | 118/49.5 X |
| 3,340,848 | 9/1967 | Kersting | 118/49.5 |
| 3,367,303 | 2/1968 | Bostic et al. | 118/49.5 |
| 3,372,671 | 3/1968 | Chu | 118/49.5 |
| 3,492,969 | 2/1970 | Emeis | 118/49.1 |
| 3,705,567 | 12/1972 | Emeis | 118/49 |
| 3,746,496 | 7/1973 | Dietz et al. | 118/49.5 X |
| 3,757,071 | 9/1977 | Stut | 219/10.43 |
| 3,820,935 | 6/1974 | Dietze | 118/49.1 X |
| 3,918,396 | 11/1975 | Dietze et al. | 118/49.1 |
| 3,919,968 | 11/1975 | Sandmann et al. | 118/49.1 X |

Primary Examiner—Morris Kaplan
Attorney, Agent, or Firm—Hill, Gross, Simpson, Van Santen, Steadman, Chiara & Simpson

[57] ABSTRACT

A non-contaminating thermal stress-free reaction container for thermal deposition of elemental silicon comprised of a base plate and a tubular member placed thereon which has at least the side walls of the container composed of pure silicon.

7 Claims, 1 Drawing Figure

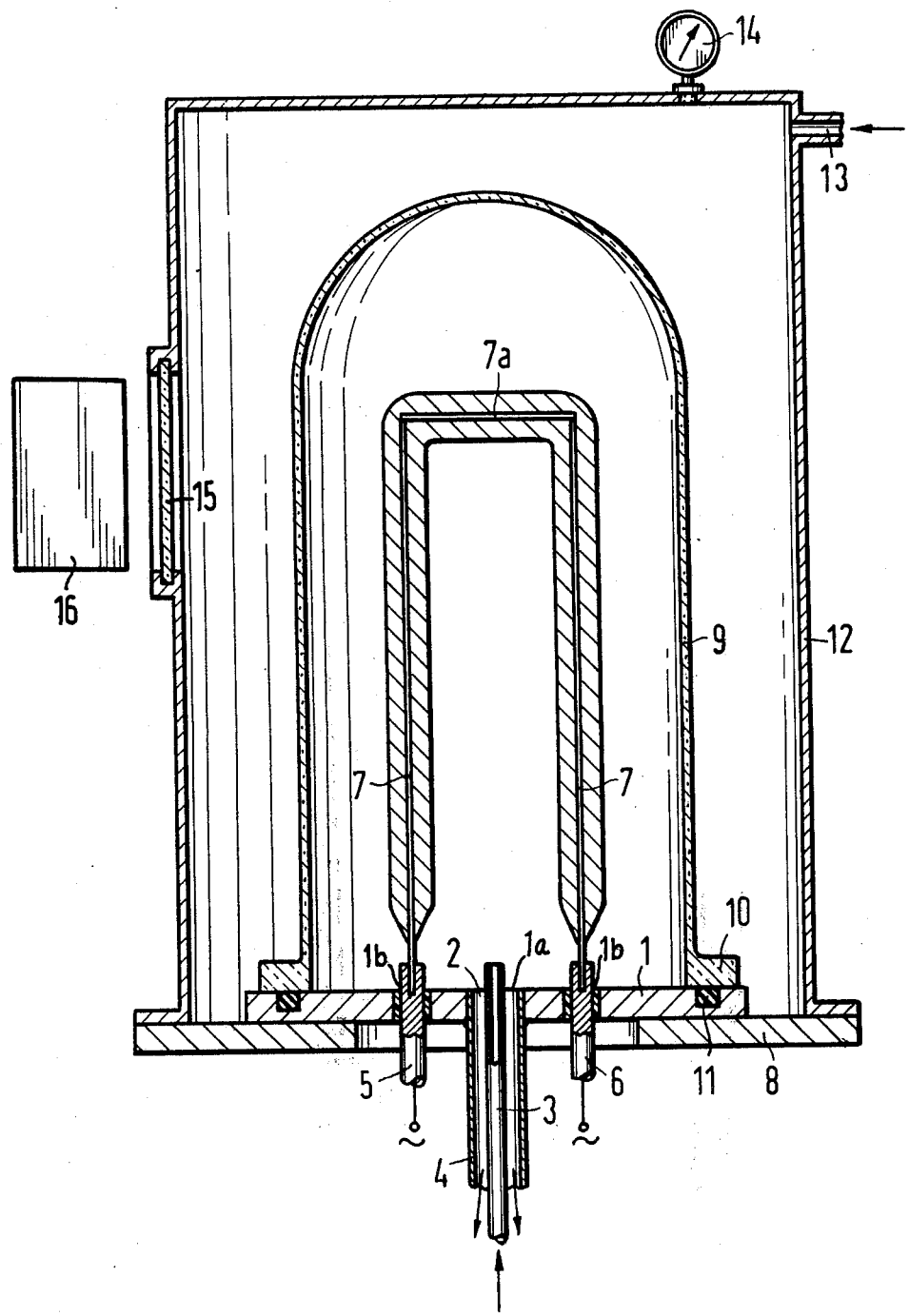

REACTION CONTAINER FOR DEPOSITION OF ELEMENTAL SILICON

BACKGROUND OF THE INVENTION

1. Field of the Invention

The invention relates to the production of a metal silicon and somewhat more particularly to a reaction container for deposition of elemental silicon onto heated silicon mandrels positioned within such a container from a reaction gas fed to the container which is capable of thermal decomposition to yield elemental silicon.

2. Prior Art

U.S. Pat. No. 3,918,396, for example, describes a reaction container for deposition of elemental silicon onto heated mandrels positioned within the container. Generally, such a container comprises a plate-shaped support member comprised of an upper silver plate and a somewhat larger lower steel plate. The support member is provided with suitable openings for mounting thereon in a gas impermeable manner spaced apart and appropriately insulated electrodes so that one end of such electrodes extends above the silver plate and the other end extends below the steel plate for connection to a voltage source. The support member also includes a suitable opening for mounting thereon in a gas impermeable manner gas inlet and outlet tubes, which may be concentrically arranged so that the inner tube comprises the gas inlet and the other tube comprises the gas outlet. A pair of elongated mandrels, preferably composed of pure silicon, are vertically mounted on the electrode ends above the silver plate and connected to one another at their upper ends with a bridge member composed of a temperature-resistant electrically conductive material. The quartz bell jar, which may include a flange along the lower edge thereof, is positioned in a gas impermeable manner on the silver plate and out of contact with the steel plate. This combination of bell jar and silver plate define the reaction container, which in the embodiment described in U.S. Pat. No. 3,918,396 is surrounded by a pressure chamber containing a pressurized gas forcing the lower edge of the bell jar against the silver plate in a gas impermeable manner. The pressure chamber is defined by a steel or the like container adapted to be positioned onto the steel plate of the earlier described support member and includes a gas inlet for the pressurized gas and a monometer for controlling the pressure within the chamber of the steel container. A pressure-resistant observation window may be provided along a wall portion of the pressure container for observing the deposition of silicon on the mandrels within the bell jar.

When this type of apparatus is utilized for depositing large amounts of silicon, difficulties are encountered in that the first deposited silicon is purer than the later deposited material. Apparently, this is due to increasing thermal stresses on the quartz or rotosil bell jar.

Of course, this drawback is also present when more conventional reaction containers are used, i.e., the reaction apparatus as described in U.S. Pat. No. 3,918,396 but without an external pressure container.

The thermal stresses on the walls of a reaction container cannot be easily compensated by a corresponding cooling because this would endanger the deposition process occuring within the reaction container.

SUMMARY OF THE INVENTION

The invention provides a reaction container of the type described wherein the prior art disadvantages are eliminated and/or minimized In accordance with the principles of the invention, at least the lateral walls or wall portions of a silicon deposition reaction container are formed of pure silicon. In a preferred embodiment of the invention, the entire reaction container, such as the earlier described bell jar, is composed of pure silicon. Such lateral wall portions of a reaction chamber may be formed by deposition of pure silicon on an appropriately shaped mandrel from a thermally decomposable gaseous silicon compound.

BRIEF DESCRIPTION OF THE DRAWINGS

The FIGURE is a partial sectional view of an embodiment of a reaction container constructed in accordance with the principles of the invention.

DESCRIPTION OF THE PREFERRED EMBODIMENTS

The invention provides a reaction container for thermal deposition of elemental silicon which is substantially non-contaminating and thermal stress-free so that relatively thick layers of elemental silicon which are of uniform purity throughout the thickness thereof may be readily produced.

In accordance with the principles of the invention, the reaction container is comprised of a silver base plate and a tubular member closed at the upper end thereof and open at the lower end, which lower end is in contact with the base plate so as to define a reaction chamber therein. At least the lateral side wall portions of the tubular member are composed of pure silicon. In a preferred embodiment, the entire tubular member is composed of the pure silicon.

An embodiment of the invention is shown in the drawing. A silver base plate 1 may be provided with a centrally located aperture 1a and a pair of spaced-apart apertures 1b, 1b, respectively. A pair of concentrically mounted tubes 4 and 3 are provided so that the outer larger diameter tube 4 is joined in a gas impermeable manner to the base plate 1 at the periphery of aperture 1a. A suitable reaction gas source (not shown) may be connected to the inner smaller diameter tube 3 for controlled feeding of a reaction gas therethrough. Spent reaction gas may be withdrawn through tube 4. A pair of electrodes 5 and 6 are each inserted within the respective apertures 1b, 1b and suitably insulated from the silver base plate 1, as with a gas impermeable dielectric plastic material, so that an upper end thereof extends above the base plate 1 while a lower end thereof extends beneath the base plate 1 and is connected to a suitable voltage or energy source. The electrodes also function as supports for a pair of rod-shaped carrier members or mandrels 7, which may be composed of pure silicon. The mandrels are of equal length and are vertically supported at one end thereof by the respective electrodes and joined together across the upper ends thereof with a bridge member 7a, which may be composed of a temperature-resistant electrically conductive material or of silicon.

The silver base plate 1 is attached in a gas impermeable manner to a suitable perforated support plate 8 composed, for example of steel, such as Va steel.

In the embodiment illustrated, the upstanding mandrels and adjacent space are enclosed by a tubular member 9 in the form of a bell jar composed of pure silicon. The tubular member 9 is sealed in a gas impermeable manner to the base plate. Such a reaction container is of particular advantage because of the thermal screening provided to the reaction chamber. In the form shown, the tubular member or bell jar 9 is provided with flange 10 along the lower edge of the bell jar so as to facilitate forming a gas impermeable seal between the lower edge of the bell jar and the silver base plate. An O-ring 11 may be provided between the base plate and the bell jar to improve the seal therebetween.

In another embodiment of the invention, the tubular member 9 may be comprised of a silicon tube of a size similar to the bell jar and which is either closed at one end thereof or opened at both ends thereof. Such silicon tubes may be produced in accordance with the technique described in German Offenlegungsschrift 2,050,076 (which essentially corresponds to U.S. Pat. No. 3,746,496). Silicon tubes which are closed at one end thereof during their manufacturing process may be utilized as such to form the reaction container of the invention. In instances where an open-ended silicon tube is utilized, it is necessary to hermetically seal the upper end thereof with a lid composed of fine silver, VA steel, graphite or silicon. With this type of arrangement (i.e., when the upper wall of the reaction container is not composed of silicon) it is advantageous to subject such wall to a sufficiently low temperature during the deposition process to substantially prevent any silicon from being deposited thereon during the deposition process. This may be accomplished by using a bridge member 7a which has a sufficiently large diameter so that it does not heat up sufficiently for silicon deposition. The upper portion of the reaction container, i.e., the tubular member, whether a bell jar, a closed tube or an open tube, is preferably so formed that the lower edge thereof includes a flange, which may be suitably ground to provide a matching surface for mating with the base plate in a gas impermeable manner.

A method for producing a pure silicon bell jar, such as shown in the drawing, may comprise a technique utilized to produce silicon tubes. For example, a graphite mandrel having a shape and dimension corresponding to a desired silicon bell jar may be heated in an inductive alternating field in the presence of a suitable reaction gas capable of yielding elemental silicon (such a reaction gas may comprise a mixture of hydrogen or some other reducing gas and a silicon halogenite such as $SiHCl_3$ or $SiCl_4$ or some other thermally decomposable gaseous silicon compound), so that the mandrel attains a temperature of about 1000° to 1200° C. as evenly as possible and in the absence of oxygen or some other oxidizing agent whereby a layer of elemental silicon precipitates onto the mandrel in a uniform wall thickness of about 2 to 4 mm.

This type of procedure is known, for example, from German Offenlegungsschrift 2,022,025 (which essentially corresponds to U.S. Ser. No. 87,205, filed Nov. 5, 1970, now abandoned).

When producing hollow semiconductor members with the aid of a graphite mandrel as described above, it is preferable to utilize a rotationally symmetrical bell jar-shaped hollow mandrel member. A rod-shaped electrode may then be positioned inside such a hollow mandrel so as to contact the apex of the dome of the bell jar-shaped mandrel and a ring-shaped electrode may be positioned so as to contact the inner circumferential edge of such mandrel. This mandrel-electrode structure may be then positioned in a suitable reaction container, for example, such as shown in German Pat. No. 1,805,970 (which essentially corresponds to U.S. Pat. No 3,892,827), and be subjected to a uniform effect of a reaction gas, which upon contact with the heated mandrel thermally decomposes and deposits pure silicon on the periphery thereof until a layer in a thickness of about 2 to 4 mmm has grown. After cooling, the mandrel is simply pulled from the outer silicon member without destruction thereof. The lower edge of the silicon bell-shaped member may then be ground to define a planar surface, which when brought into contact with the base plate (composed of silver or VA steel) defines a gas impermeable seal.

German Offenlegungsschrift 2,060,651 (which essentially corresponds to U.S. Ser. No. 205,492, filed Dec. 7, 1971, now abandoned), discloses a technique for producing silicon tubes having a bulge or the like at the edges thereof via thermal deposition from a gaseous reaction phase. Generally, this is accomplished by providing a ring-shaped indentation in the mandrel which is of a size corresponding to the desired bulge in the silicon tube or by providing increased heat to a select ring-shaped zone of the mandrel in relation to the heat supplied to the remaining mandrel surface, as by including an inner conductor positioned concentrically within the mandrel and which is provided with a suitable current.

In a similar fashion, a ring-shaped bulge may be produced on a silicon bell jar or tube of the type used as a tubular member in the reaction container constructed in accordance wtih the principles of the invention. Such a ring-shaped bulge facilitates the planar grinding of the lower edge of a silicon jar for improved hermetic sealing thereof with the base plate. However, such a bulge may also be provided with a precisely ground groove or ridge at the inside or outside surface thereof for mating with a correspondingly shaped ridge or groove on the base plate so as to form an improved seal.

The hermetic or gas impermeable sealing between a silicon tubular member 9 (whether in the shape of a bell jar or a tube) and the base plate 1 may be attained via an oil seal or some other suitable gas impermeable sealing means. However, a preferred embodiment comprises positioning the reaction container (members 9 and 1) in a pressure housing 12 as shown in the drawings.

In the embodiment shown, a pressure housing 12, composed of a metal or the like, is positioned so as to encompass the tubular member 9 and rest on the outer edges of the support plate 8. The pressure housing 12 is provided with a gas inlet 13 for a pressurized gas, preferably an inert gas such as nitrogen or a rare gas. A monometer 14 is also provided on housing 12 for regulating a desired amount of pressure within the housing 12. The pressure-resistant window 15 may be provided in a wall of housing 12 to enable an operator to observe the silicon deposition process occurring within the reaction container.

However, since the lateral silicon walls of member 9 are not light-transparent and cannot be readily provided with a suitable transparent window which can withstand the large temperature ranges encountered, an operator has difficulty in visually observing the deposition process occurring on mandrels 7. Pure silicon is, however, transparent to infrared having a wavelength wherein λ > 1.1 μm. Accordingly, the lateral walls of a tubular member 9, which may have a thickness of several cm are sufficiently permeable by infrared radiation to allow one to observe the glowing mandrels 7 and 7a without difficulty via an infrared picture converting means positioned outside the reaction container and outside the window 15 of the pressure housing 12 (which window may also be composed of silicon).

In the embodiment shown, such an infrared picture converting means comprises a television camera 16 associated with an infrared optical system, an infrared-sensitive vidicon, and coupled with an image-reproducing device. As shown, this system is positioned outside the pressure housing in line for observing and supervising the deposition process occurring within the reaction container.

Preferably, the television camera 16 is orientated so that the sensing lines thereof are orientated perpendicularly to the infrared image of the mandrels 7 which are projected by the optical system of the camera onto the vidicon of the camera. When the camera remains stationary, the electron beam which senses the image on the vidicon is modulated by the infrared image so that the modulation of the beam is fixed with respect to time by the diameter of the image of the mandrels 7 at the intersection of the respective sensing lines and the amplitude of the beam is fixed by the infrared brightness of the image at the respective sensing lines. In this manner, the thickness of the silicon layer grown on mandrels 7 can be observed and controlled, along with the temperature thereof, in a manner similar to that disclosed in German Offenlegungsschrift 2,113,720 (which essentially corresponds to U.S. Pat. No. 3,757,071) in relation to control and observation of a crucible-free zone melt process via an optical television system.

As is apparent from the foregoing specification, the present invention is susceptible of being embodied with various alterations and modifications which may differ particularly from those that have been described in the preceding specification and description. For this reason, it is to be fully understood that all of the foregoing is intended to merely be illustrative and is not to be construed or interpreted as being restrictive or otherwise limiting of the present invention, excepting as it is set forth and defined in the hereto-appendant claims.

I claim as my invention:

1. In a reaction container for deposition of elemental silicon from a reaction gas capable of thermally decomposing and depositing elemental silicon onto heated silicon mandrels positioned within the reaction container, wherein the reaction container includes a plate-shaped support member having apertures for mounting thereon gas inlet and outlet tubes for supplying and removing the reaction gas to and from such container as well as spaced-apart electrodes which support the mandrels and a tubular member positionable in a gas impermeable manner onto said support member so as to encompass the mandrels, the improvement comprising wherein:

said tubular member has all portions thereof composed of pure silicon;

the mandrels positioned within said tubular member comprise two parallel silicon rods having a lower end thereof mounted on the electrodes and having a conductive bridge member connected across the upper ends thereof, said bridge member having a cross-section of such size that the current passing through the mandrels and the bridge member from the electrodes is insufficient to heat such bridge member up to the deposition temperature but said current is sufficient to heat the mandrels to the deposition temperature;

the tubular member is forced against the plate-shaped support member in a gas impermeable manner with the aid of a pressurized inert gas contained within a pressure housing sufficient to encompass said tubular member and support member;

the wall portions of the tubular member laterally encompassing the mandrels are of a thickness sufficient to allow infrared radiation emitted by the heated mandrels during the deposition process to pass therethrough, and including an infrared image-converting means positioned outside the reaction container for sensing such infrared radiation and producing signals for controlling the dimensions of the silicon layers deposited on the mandrels and for controlling the temperature of such mandrels; and said infrared image-converting means comprising a television camera having a optical reproduction system adapted for infrared radiation and an infrared responsive vidicon coupled therewith in an operative manner.

2. In a reaction container as defined in claim 1 wherein said wall portions of the tubular member laterally encompassing the mandrels, are of a thickness in the range of about 1 to 4 cm.

3. In a reaction container as defined in claim 2 wherein said wall portions of the tubular member laterally encompassing the mandrels, are of a thickness in the range of about 2 to 3 cm.

4. In a reaction container as defined in claim 1 wherein said tubular member includes a lower peripheral planar end surface adapted for mating with an upfacing surface of the plate-shaped support member.

5. In a reaction container as defined in claim 1 wherein said plate-shaped support member is composed of a metal selected from the group consisting of silver, fine silver and VA steel.

6. In a reaction container as defined in claim 1 wherein said tubular member is in the shape of a bell jar.

7. In a reaction container as defined in claim 1 wherein said tubular member comprises and open-ended silicon tube having an upper end thereof hermetically sealed with a lid composed of a material selected from the group consisting of silver, fine silver, VA steel and pure graphite.

* * * * *